(12) United States Patent
Jin et al.

(10) Patent No.: US 9,695,506 B2
(45) Date of Patent: Jul. 4, 2017

(54) METHOD FOR MAKING MICROSTRUCTURE ON SUBSTRATE

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/737,843

(22) Filed: Jun. 12, 2015

(65) Prior Publication Data

US 2015/0376777 A1    Dec. 31, 2015

(30) Foreign Application Priority Data

Jun. 27, 2014    (CN) .......................... 2014 1 0295285

(51) Int. Cl.
| | | |
|---|---|---|
| *B32B 37/00* | (2006.01) | |
| *C03C 25/68* | (2006.01) | |
| *C23F 3/00* | (2006.01) | |
| *H01L 21/302* | (2006.01) | |
| *H01L 21/461* | (2006.01) | |
| *C23C 16/04* | (2006.01) | |
| *H01B 1/04* | (2006.01) | |
| *C23C 14/04* | (2006.01) | |
| *C23F 4/00* | (2006.01) | |
| *H01L 21/033* | (2006.01) | |

(Continued)

(52) U.S. Cl.
    CPC .......... *C23C 16/045* (2013.01); *C23C 14/046* (2013.01); *C23C 16/042* (2013.01); *C23F 4/00* (2013.01); *H01B 1/04* (2013.01); *H01L 21/0332* (2013.01); *H01L 21/3081* (2013.01); *H01L 21/30621* (2013.01); *H01L 21/31144* (2013.01); *H01L 21/32136* (2013.01); *H01L 21/32139* (2013.01); *C23C 16/45525* (2013.01)

(58) Field of Classification Search
    None
    See application file for complete search history.

(56) References Cited

U.S. PATENT DOCUMENTS

| 7,563,722 B2 | 7/2009 | Yaniv et al. |
|---|---|---|
| 2009/0197082 A1 | 8/2009 | Jiang et al. |

(Continued)

FOREIGN PATENT DOCUMENTS

| TW | I380949 | 1/2013 |
|---|---|---|

*Primary Examiner* — Stephanie Duclair
(74) *Attorney, Agent, or Firm* — Steven Reiss

(57) ABSTRACT

The disclosure relates to a method of making a microstructure on a substrate. A carbon nanotube structure is provided, wherein the carbon nanotube structure includes a number of carbon nanotubes arranged orderly and defines a number of first openings. A carbon nanotube composite is formed by applying a protective layer on the carbon nanotube structure, wherein the carbon nanotube composite structure defines a number of second openings. The carbon nanotube composite structure is placed on a surface of the substrate, wherein parts of the surface are exposed from the number of second openings. The surface of the substrate is dry etched by using the carbon nanotube composite structure as a mask.

6 Claims, 9 Drawing Sheets

(51) Int. Cl.
*H01L 21/306* (2006.01)
*H01L 21/308* (2006.01)
*H01L 21/311* (2006.01)
*H01L 21/3213* (2006.01)
*C23C 16/455* (2006.01)

(56) References Cited

U.S. PATENT DOCUMENTS

2010/0147798 A1* 6/2010 Lin ................... H01L 31/02363
216/49
2011/0034008 A1* 2/2011 Kianian .............. H01L 21/0332
438/478

* cited by examiner

METHOD FOR MAKING MICROSTRUCTURE ON SUBSTRATE

CROSS-REFERENCE TO RELATED APPLICATIONS

This application claims all benefits accruing under 35 U.S.C. §119 from China Patent Application No. 201410295285.6, filed on Jun. 27, 2014, in the China Intellectual Property Office, disclosure of which is incorporated herein by reference.

FIELD

The subject matter herein generally relates to methods for making microstructure on a surface of substrate, in particular, to methods for making microstructure on a surface of substrate based on carbon nanotubes.

BACKGROUND

Usually, one needs to make microstructure on a substrate during the process of making a semiconductor device. Currently, the method for making microstructure is electron beam lithography, plasma etching etc. In the methods above, the mask layer should be patterned by complicated steps. Also, the methods above need large-scale equipment, and are complicated and difficult to make microstructure in nano scale.

What is needed, therefore, is to provide a method for solving the problem discussed above.

BRIEF DESCRIPTION OF THE DRAWINGS

Implementations of the present technology will now be described, by way of example only, with reference to the attached figures, wherein.

DETAILED DESCRIPTION

Figure 1:
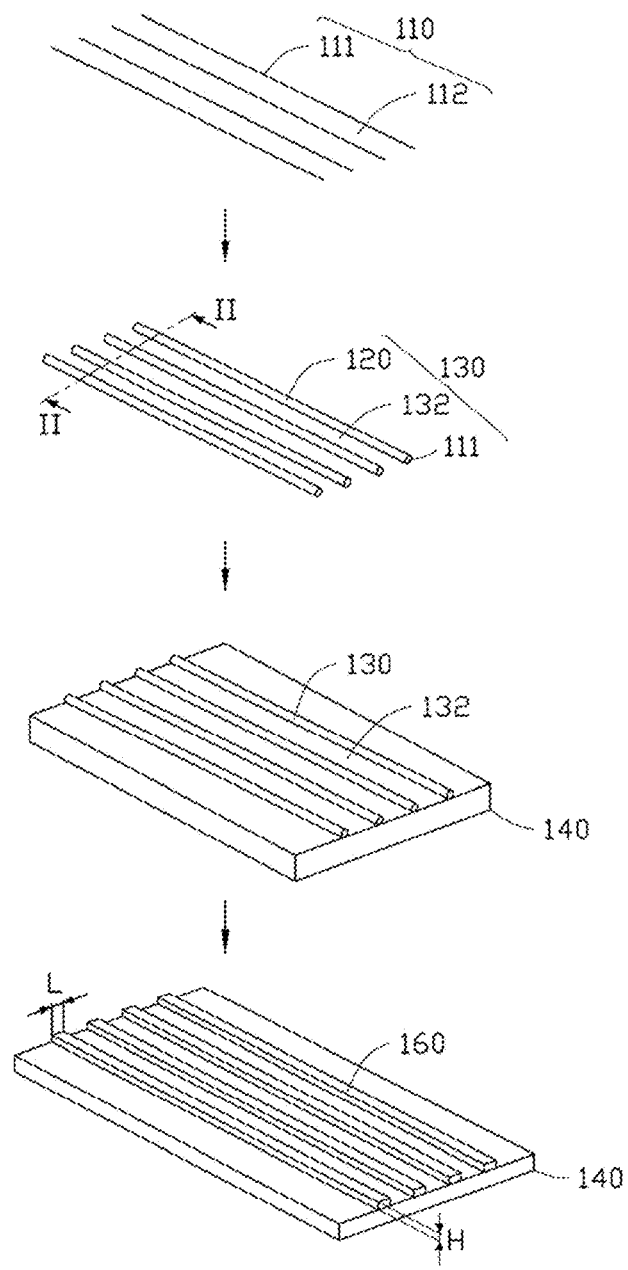
FIG. 1 is a flowchart of one embodiment of a method for making a microstructure on a surface of a substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Referring to FIG. 1, a method for making a microstructure 160 on a surface of a substrate 140 of one embodiment includes the following steps:

step (S10), providing a carbon nanotube structure 110, wherein the carbon nanotube structure 110 includes a plurality of carbon nanotubes 111 arranged orderly and defines a plurality of first openings 112;

step (S11), forming a carbon nanotube composite structure 130 by applying a protective layer 120 on a surface of the carbon nanotube structure 110, wherein the carbon nanotube composite structure 130 defines a plurality of second openings 132;

step (S12), placing the carbon nanotube composite structure 130 on a surface 142 of a substrate 140, wherein parts of the surface 142 are exposed from the plurality of second openings 132; and step (S13), dry etching the surface 142 using the carbon nanotube composite structure 130 as a mask.

In step (S10), the carbon nanotube structure 110 is a free-standing structure and can be drawn from a carbon nanotube array. The term "free-standing structure" includes that the carbon nanotube structure 110 can sustain the weight of itself when it is hoisted by a portion thereof without any significant damage to its structural integrity. Thus, the carbon nanotube structure 110 can be suspended by two spaced supports.

The plurality of carbon nanotubes 111 can be single-walled carbon nanotubes, double-walled carbon nanotubes, or multi-walled carbon nanotubes. The length and diameter of the plurality of carbon nanotubes 111 can be selected according to need. The diameter of the single-walled carbon nanotubes can be in a range from about 0.5 nanometers to about 10 nanometers. The diameter of the double-walled carbon nanotubes can be in a range from about 1.0 nanometer to about 15 nanometers. The diameter of the multi-walled carbon nanotubes can be in a range from about 1.5 nanometers to about 50 nanometers. In one embodiment, the length of the carbon nanotubes 111 can be in a range from about 200 micrometers to about 900 micrometers.

The plurality of carbon nanotubes 111 are orderly arranged to form an ordered carbon nanotube structure. The plurality of carbon nanotubes 111 extend along a direction substantially parallel to the surface of the carbon nanotube structure 110. The term 'ordered carbon nanotube structure' includes, but is not limited to, a structure wherein the plurality of carbon nanotubes 111 are arranged in a consistently systematic manner, e.g., the plurality of carbon nanotubes 111 are arranged approximately along a same direction.

The first opening 112 extends throughout the carbon nanotube structure 110 along the thickness direction thereof. The first opening 112 can be a hole defined by several adjacent carbon nanotubes 111, or a gap defined by two substantially parallel carbon nanotubes 111 and extending along axial direction of the carbon nanotubes 111. The hole shaped first opening 112 and the gap shaped first opening 112 can exist in the carbon nanotube structure 110 at the same time. Hereafter, the size of the first opening 112 is the diameter of the hole or width of the gap. The sizes of the first openings 112 can be different. The average size of the first openings 112 can be in a range from about 10 nanometers to about 500 micrometers. For example, the sizes of the first openings 112 can be about 50 nanometers, 100 nanometers, 500 nanometers, 1 micrometer, 10 micrometers, 80 micrometers, or 120 micrometers.

The carbon nanotube structure 110 can include at least one carbon nanotube film, at least one carbon nanotube wire, or combination thereof In one embodiment, the carbon nanotube structure 110 can include a single carbon nanotube film or two or more carbon nanotube films stacked together. Thus, the thickness of the carbon nanotube structure 110 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the carbon nanotube structure 110 is formed by folding a single carbon nanotube wire. In one embodiment, the carbon nanotube structure 110 can include a layer of parallel and spaced carbon nanotube wires. Also, the carbon nanotube structure 110 can include a plurality of carbon nanotube wires crossed or weaved together to form a carbon nanotube net. The distance between two adjacent parallel and spaced carbon nanotube wires can be in a range from about 0.1 micrometers to about 200 micrometers. In one embodiment, the distance between two adjacent parallel and spaced carbon nanotube wires is in a range from about 10 micrometers to about 100 micrometers. The gap between two adjacent substantially parallel carbon nanotube wires is defined as the first openings 112. The size of the first openings 112 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 3:
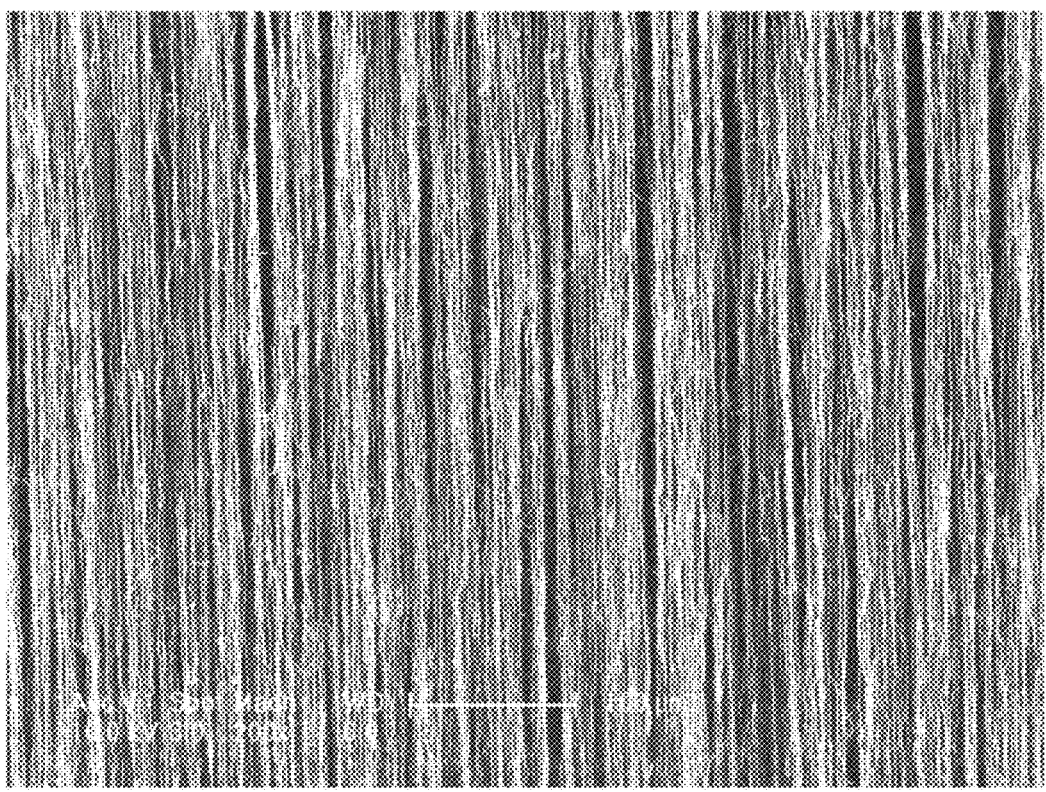
FIG. 3 is a Scanning Electron Microscope (SEM) image of a drawn carbon nanotube film of one embodiment.

In one embodiment, the carbon nanotube structure 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIG. 3, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. As can be seen in FIG. 3, some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film defines a plurality of first openings 112 between adjacent carbon nanotubes.

Figure 4:
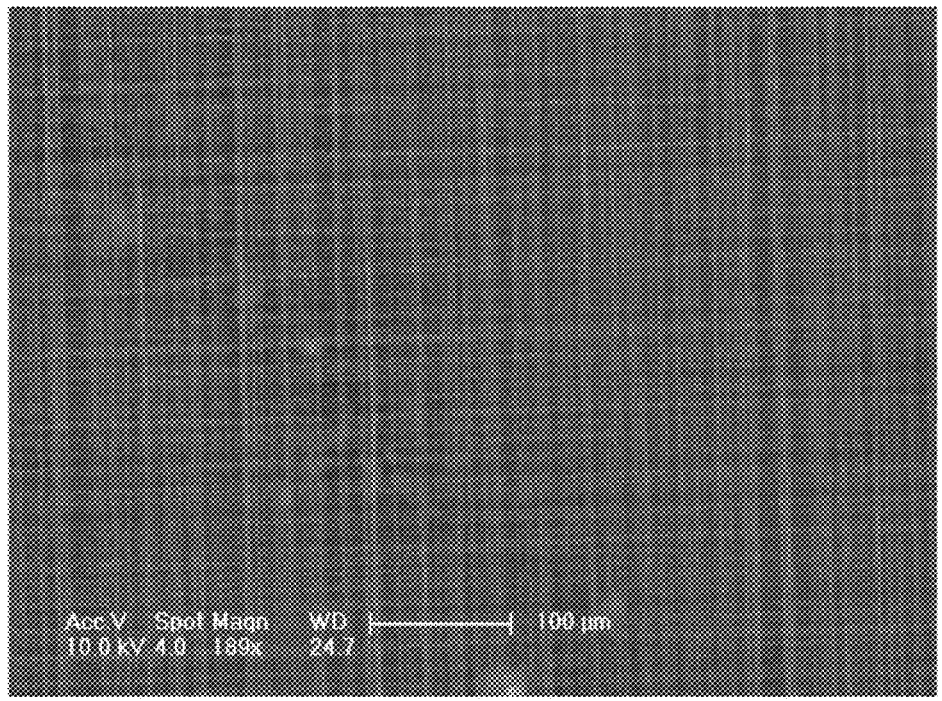
FIG. 4 is an SEM image of cross-stacked drawn carbon nanotube films.

The carbon nanotube structure 110 can include at least two stacked drawn carbon nanotube films. In other embodiments, the carbon nanotube structure 110 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure 110. In one embodiment of FIG. 4, the carbon nanotube structure 110 is shown with the aligned directions of the carbon nanotubes between adjacent stacked drawn carbon nanotube films at 90 degrees. Stacking the carbon nanotube films will also add to the structural integrity of the carbon nanotube structure 110.

Figure 5:
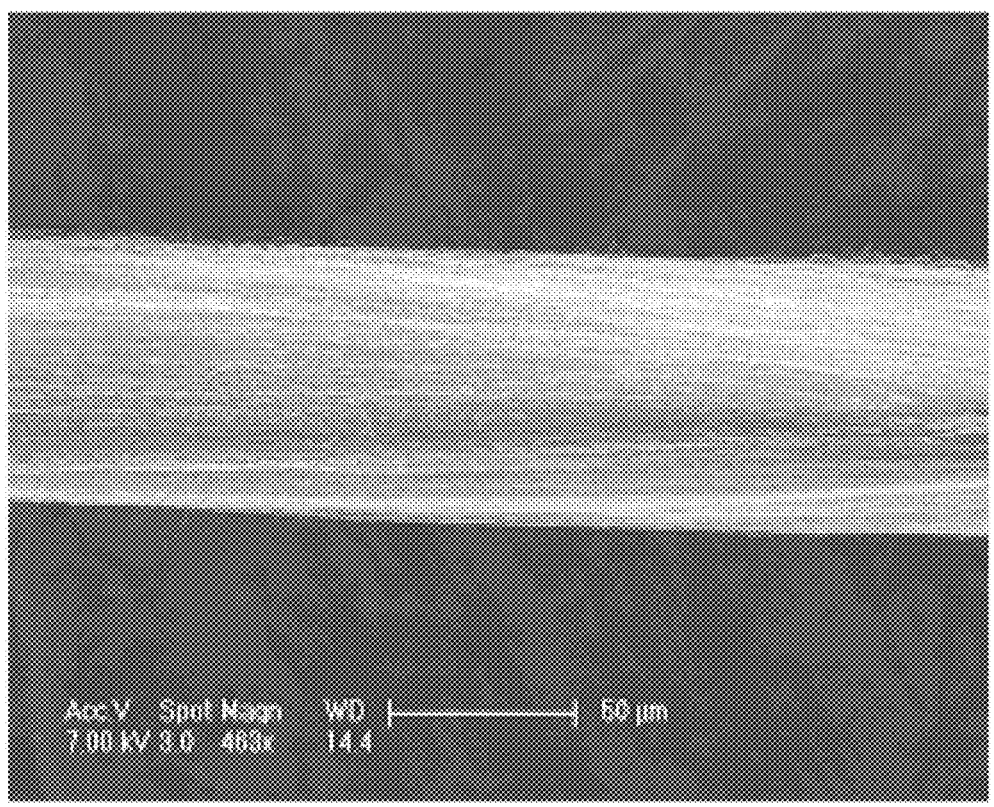
FIG. 5 is an SEM image of an untwisted carbon nanotube wire of one embodiment.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 5, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 6:
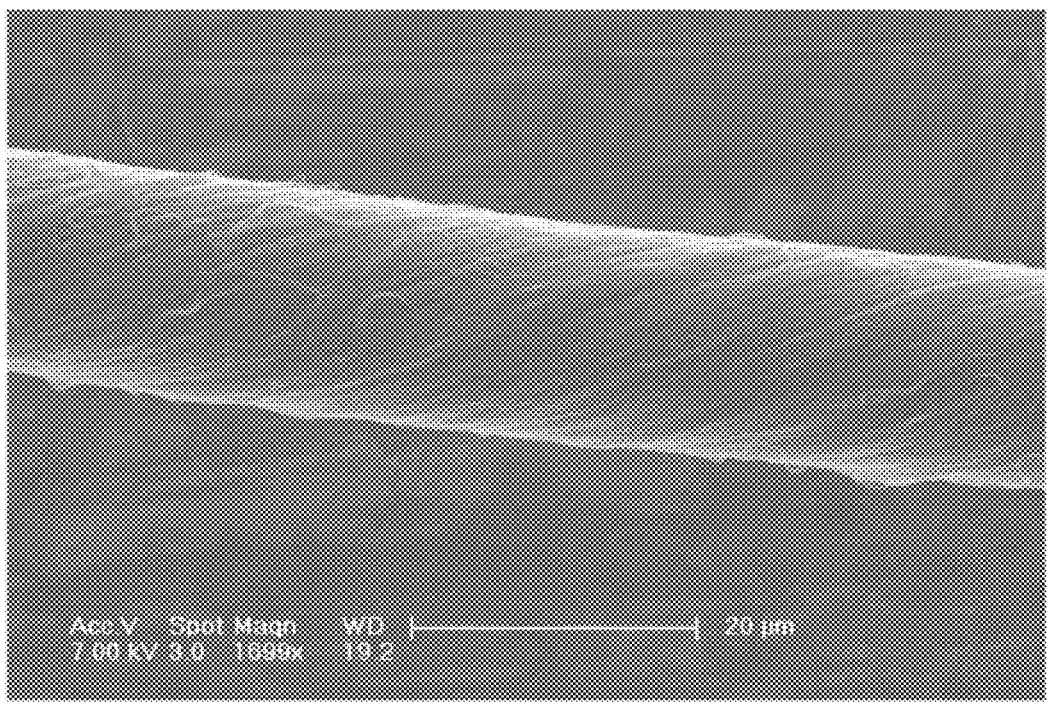
FIG. 6 is an SEM image of a twisted carbon nanotube wire of one embodiment.

The twisted carbon nanotube wire can be formed by twisting a drawn carbon nanotube film using a mechanical force to turn the two ends of the drawn carbon nanotube film in opposite directions. Referring to FIG. 6, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

In step (S11), the carbon nanotube structure 110 is suspended in a depositing chamber during depositing the protective layer 120 so that two opposite surfaces of the carbon nanotube structure 110 are coated with the protective layer 120. In some embodiments, each of the plurality of carbon nanotubes 111 is fully enclosed by the protective layer 120.

In one embodiment, the carbon nanotube structure 110 is located on a frame so that the middle portion of the carbon nanotube structure 110 is suspended through the through hole of the frame. The frame can be any shape, such as a quadrilateral. The carbon nanotube structure 110 can also be suspended by a metal mesh or metal ring.

The method of depositing the protective layer 120 can be physical vapor deposition (PVD), chemical vapor deposition (CVD), atomic layer deposition (ALD), magnetron sputtering, or spraying.

The plurality of second openings 132 are formed because of the plurality of first openings 112. The plurality of second openings 132 and the plurality of first openings 112 have the same shape and different size. The size of the plurality of second openings 132 is smaller than that of the plurality of first openings 112 because the protective layer 120 is deposited in the plurality of first openings 112.

The thickness of the protective layer 120 is in a range from about 3 nanometers to about 50 nanometers. In one embodiment, the thickness of the protective layer 120 is in a range from about 3 nanometers to about 20 nanometers. If the thickness of the protective layer 120 is less than 3 nanometers, the protective layer 120 cannot prevent the carbon nanotubes 111 from being destroyed in following etching process. If the thickness of the protective layer 120 is greater than 50 nanometers, the plurality of first openings 112 may be fully filled by the protective layer 120 and the plurality of second openings 132 cannot be obtained.

The material of the protective layer 120 can be metal, metal oxide, metal nitride, metal carbide, metal sulfide, silicon oxide, silicon nitride, or silicon carbide. The metal can be gold, nickel, titanium, iron, aluminum, titanium, chromium, or alloy thereof The metal oxide can be alumina, magnesium oxide, zinc oxide, or hafnium oxide. The material of the protective layer 120 is not limited above and can be any material as long as the material can be deposited on the carbon nanotube structure 110, would not react with the carbon nanotubes 111 and would not be etched easily in following drying etching process. The protective layer 120 is combined with the carbon nanotube structure 110 by van der Waals attractive force therebetween only.

Figure 7:
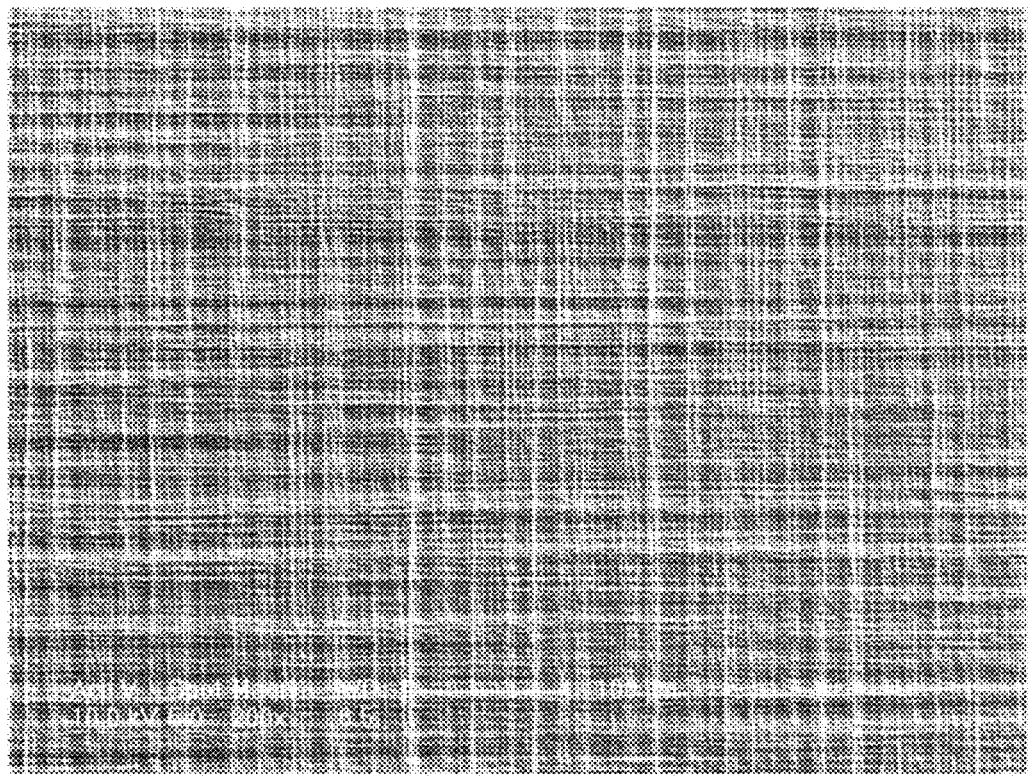
FIG. 7 is an SEM image of a carbon nanotube composite structure of one embodiment.

As shown in FIG. 7, in one embodiment, an alumina layer of 5 nanometers thickness is deposited on the carbon nanotube structure 110 by electron beam evaporation.

In step (S12), the carbon nanotube composite structure 130 can be in direct contact with the surface 142 of the substrate 140 or suspended above the surface 142 of the substrate 140 by a support. In one embodiment, the carbon nanotube composite structure 130 is transferred on the surface 142 of the substrate 140 through the frame.

Furthermore, the placing the carbon nanotube composite structure 130 on the surface 142 comprises solvent treating the substrate 140 with the carbon nanotube composite structure 130 thereon. Because there is air between the carbon nanotube composite structure 130 and the surface 142 of the substrate 140, the solvent treating can exhaust the air and allow the carbon nanotube composite structure 130 to be closely and firmly adhered on the surface 142 of the substrate 140. The solvent treating can be applying a solvent to entire surface of the carbon nanotube composite structure 130 or immersing the entire substrate 140 with the carbon nanotube composite structure 130 in a solvent. The solvent can be water or volatile organic solvent such as ethanol, methanol, acetone, dichloroethane, chloroform, or mixtures thereof In one embodiment, the organic solvent is ethanol.

The material of the substrate 140 is not limited and can be metal, insulating material or semiconductor. The metal can be gold, aluminum, nickel, chromium, or copper. The insulating material can be silicon dioxide or silicon nitride. The semiconductor can be silicon, gallium nitride, or gallium arsenide. In one embodiment, the material of the substrate 140 is silicon dioxide layer.

In the step (S13), the dry etching can be plasma etching or reactive ion etching (RIE). In one embodiment, the dry etching is performed by applying plasma energy on the entire or part surface of the surface 142 via a plasma device. The plasma gas can be an inert gas and/or etching gases, such as argon (Ar), helium (He), chlorine ($Cl_2$), hydrogen ($H_2$), oxygen ($O_2$), fluorocarbon ($CF_4$), ammonia ($NH_3$), or air.

In one embodiment, the plasma gas is a mixture of chlorine and argon. The power of the plasma device can be in a range from about 20 watts to about 70 watts. The plasma flow of chlorine can be in a range from about 5 sccm to about 20 sccm, such as 10 sccm. The plasma flow of argon can be in a range from about 15 sccm to about 40 sccm, such as 25 sccm. When the plasma is produced in vacuum, the work pressure of the plasma can be in a range from about 3 Pa to 10 Pa, such as 6 Pa. The time for plasma etching can be in a range from about 10 seconds to about 20 seconds, such as 15 seconds.

In the plasma etching process, the plasma gas would react with the exposed portion of the substrate 140 and would not react with the protective layer 120, or reaction between the plasma gas and the protective layer 120 is much slower than reaction between the plasma gas and the substrate 140. The selection relationship of the plasma gas, material of the substrate 140 and material of the protective layer 120 is shown in Table 1 below.

TABLE 1

| Number | Substrate | protective layer | Plasma gas |
| --- | --- | --- | --- |
| 1 | Al | $SiO_2$ | $Cl_2$ or $BCl_3$ |
| 2 | $SiO_2$ | Al, Cr, Fe, Ti, Ni, or Au | $CF_4$ |

TABLE 1-continued

| Number | Substrate | protective layer | Plasma gas |
|---|---|---|---|
| 3 | $SiN_x$ | Al, Cr, Fe, Ti, Ni, or Au | $CF_4$ |
| 4 | GaN | $Al_2O_3$ | $Cl_2$ or $Ar_2$ |
| 5 | Au, Cr or Ni | $SiO_2$ or $SiN_x$ | $O_2$ or $Ar_2$ |
| 6 | Cu | $SiO_2$ or $SiN_x$ | $O_2$ or $BCl_3$ |

In the etching process, because the etching gas reacts with the substrate 140 and does not react with the protective layer 120, the exposed portion of the substrate 140 would be etched gradually and the portion of the substrate 140 that are covered by the carbon nanotube composite structure 130 would not be etched.

The final microstructure 160 and the carbon nanotube composite structure 130 substantially have the same pattern. When the carbon nanotube structure 110 is a single drawn carbon nanotube film or includes a plurality of drawn carbon nanotube films with all carbon nanotube being arranged substantially along the same direction, the microstructure 160 includes a plurality of nanowires arranged substantially along the same direction. When the carbon nanotube structure 110 includes a plurality of crossed drawn carbon nanotube films, the microstructure 160 includes a plurality of nanowires crossed with each other.

Figure 2:
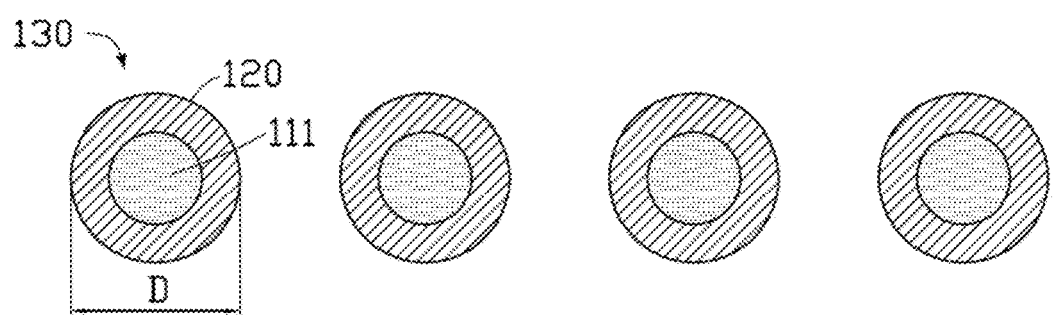
FIG. 2 is a cross-sectional view along line II-II of FIG. 1.

As shown in FIGS. 1 and 2, in one embodiment, the carbon nanotube composite structure 130 includes a plurality of carbon nanotube composite wires parallel with and spaced from each other. The diameter of each of the plurality of carbon nanotube composite wires is D. The microstructure 160 includes a plurality of nanowires parallel with and spaced from each other. The width of each of the plurality of nanowires is L. The width L of the nanowire is greater than the diameter D of the carbon nanotube composite wire for about 20 nanometers to about 30 nanometers.

Figure 8:
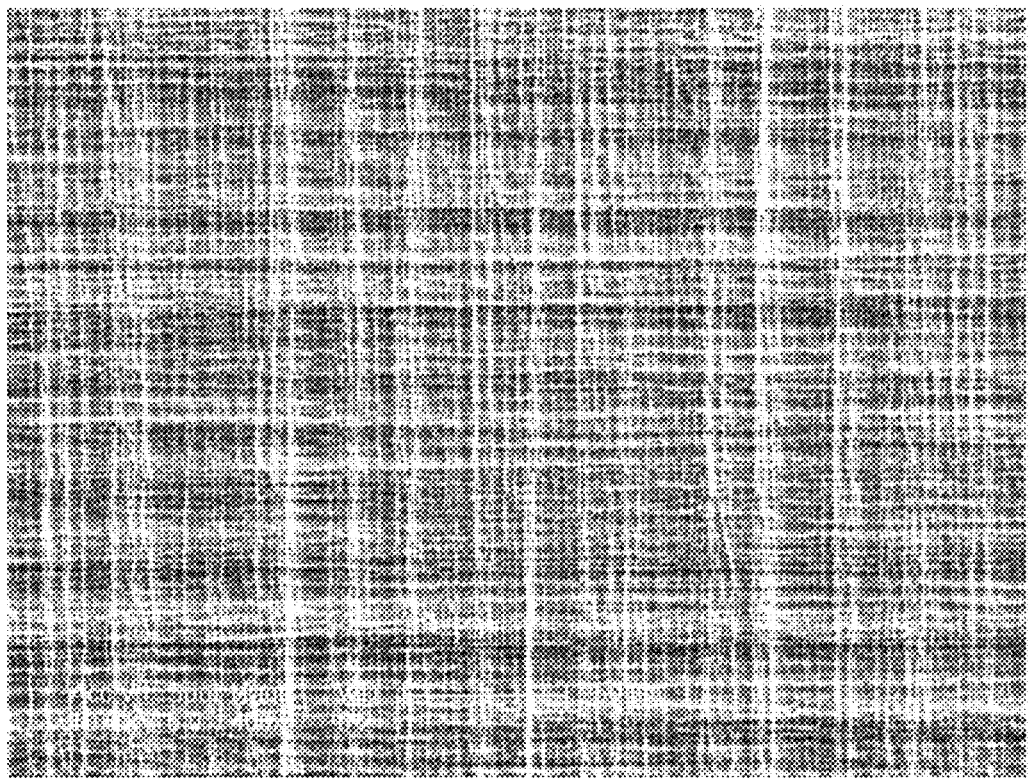
FIG. 8 is an SEM image of a microstructure of one embodiment.

The width L of the nanowires can be in a range from about 20 nanometers to about 150 nanometers. In one embodiment, the width L of the nanowires can be in a range from about 20 nanometers to about 100 nanometers. In one embodiment, the width L of the nanowires can be in a range from about 50 nanometers to about 100 nanometers. The distance between adjacent two of the nanowires can be in a range from about 10 nanometers to about 300 nanometers. In one embodiment, the distance between adjacent two of the nanowires can be in a range from about 10 nanometers to about 100 nanometers. In one embodiment, the distance between adjacent two of the nanowires can be in a range from about 100 nanometers to about 200 nanometers. The height H of the nanowire is determined by the etching time and can be in a range from about 10 nanometers to about 100 nanometers. In one embodiment, the height H of the nanowire can be in a range from about 50 nanometers to about 60 nanometers. As shown in FIG. 8, the microstructure 160 includes a plurality of nanowires crossed with each other.

Furthermore, a step (S14) of removing the carbon nanotube composite structure 130 can be performed. The removing method can be ultrasonic method, adhesive tape peeling, oxidation etc. In one embodiment, the substrate 140 with the carbon nanotube composite structure 130 thereon is place in an N-methyl pyrrolidone solution and ultrasonic treating for several minutes.

Figure 9:
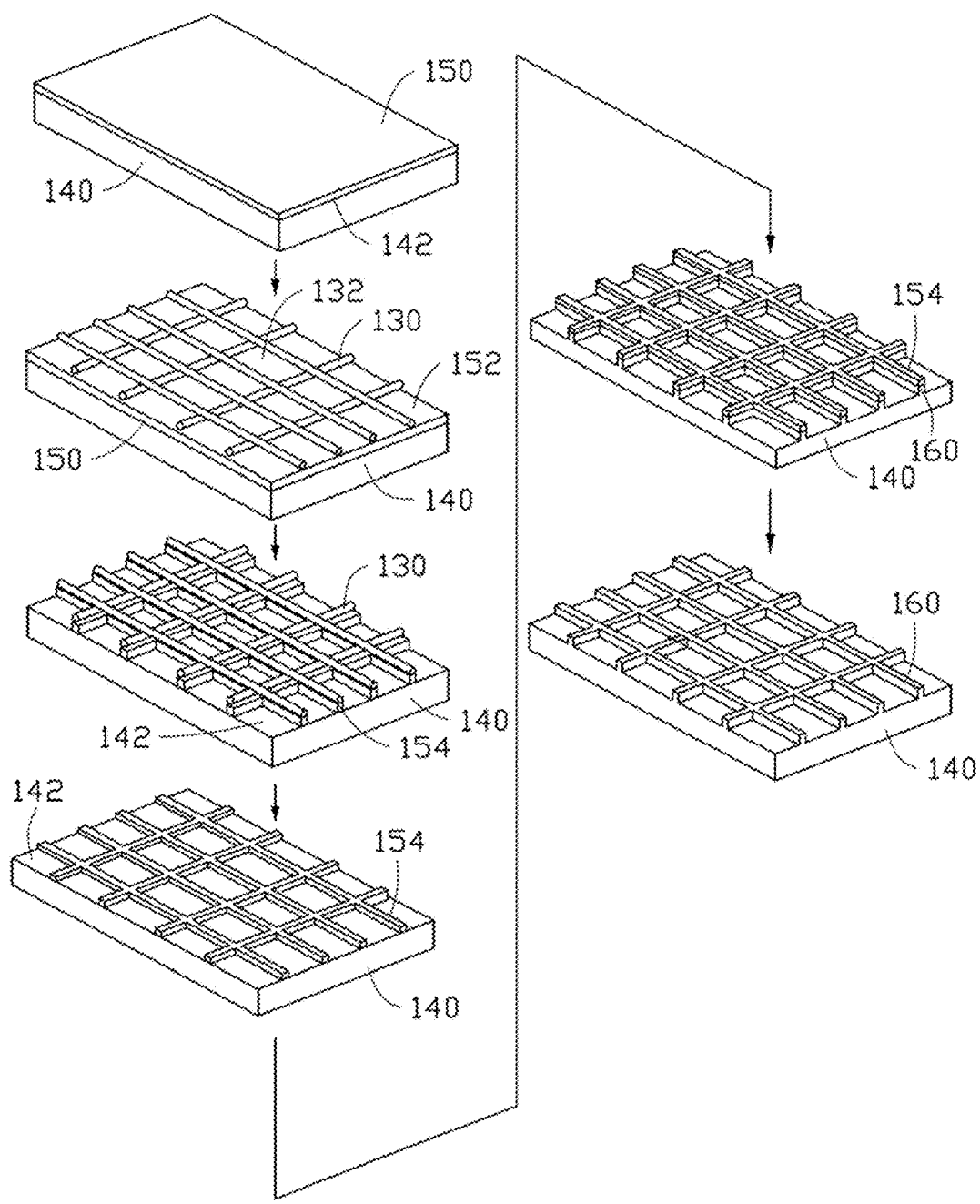
FIG. 9 is a flowchart of one embodiment of a method for making a microstructure on a surface of a substrate.

Referring to FIG. 9, a method for making a microstructure 160 on a surface of a substrate 140 of one embodiment includes the following steps:

step (S20), applying a transition layer 150 on the surface 142 of the substrate 140;

step (S21), placing the carbon nanotube composite structure 130 on a surface 152 of the transition layer 150, wherein parts of the surface 152 are exposed from the plurality of second openings 132;

step (S22), forming a patterned transition layer 154 by dry etching the surface 152 using the carbon nanotube composite structure 130 as a mask, wherein parts of the surface 142 are exposed;

step (S23), removing the carbon nanotube composite structure 130;

step (S24), dry etching the surface 142 using the patterned transition layer 154 as a mask; and step (S25), removing the patterned transition layer 154.

In step (S20), the material of the transition layer 150 is not limited and can be any material that can be deposited on the surface 142 and etched by the dry etching. The material of the transition layer 150 can be hafnium oxide, alumina, silica, aluminum, or gold. The selection relationship of the plasma gas, material of the substrate 140, material of the transition layer 150 and material of the protective layer 120 is shown in Table 2 below.

TABLE 2

| Number | Substrate | Transition layer | Protective layer | Plasma gas for etching transition layer | Plasma gas for etching substrate |
|---|---|---|---|---|---|
| 1 | Au | $SiO_2$ | Al | $CF_4$ | Ar and $O_2$ |
| 2 | Au | $Al_2O_3$ | Al | $BCl_3$ | Ar and $O_3$ |
| 3 | Au | $HfO_2$ | Al | $BCl_3$ | Ar and $O_2$ |
| 4 | Cu | $SiO_2$ | Al | $CF_4$ | $BCl_3$ and $O_2$ |
| 5 | Cu | $Al_2O_3$ | Al | $BCl_3$ | $BCl_3$ and $O_2$ |
| 6 | Cu | $HfO_2$ | Al | $BCl_3$ | $BCl_3$ and $O_2$ |
| 7 | $SiO_2$, $SiN_x$ | $Al_2O_3$ | Al, Cr, Fe, Ti, Ni or Au | $BCl_3$ and $O_2$ | $CF_4$ |
| 8 | GaN, GaAs | $SiO_2$ | $Al_2O_3$ | $CF_4$ | $Cl_2$ and $Ar_2$ |
| 9 | Cr, Ni | $Al_2O_3$ | $SiO_2$ or $SiN_x$ | $BCl_3$ and $O_2$ | $O_2$ and $Ar_2$ |

In one embodiment, the substrate 140 is an Au plate, the transition layer 150 is a SiO2 layer with a thickness of about 50 nanometers, and the protective layer 120 is an Al layer with a thickness of about 10 nanometers.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for making a microstructure on a substrate, the method comprising:

providing a carbon nanotube structure, wherein the carbon nanotube structure comprises a plurality of carbon nanotubes arranged orderly and defines a plurality of first openings;

forming a carbon nanotube composite structure by applying a protective layer on a first surface of the carbon nanotube structure, wherein the carbon nanotube composite structure defines a plurality of second openings, and the protective layer consists of a material selected from the group consisting of metal oxide, metal nitride, metal carbide, metal sulfide, silicon oxide, silicon nitride, and silicon carbide;

applying a transition layer on a second surface of the substrate, wherein the transition layer is an aluminum layer or a gold layer;

placing the carbon nanotube composite structure on a third surface of the transition layer, wherein parts of the third surface are exposed from the plurality of second openings;

forming a patterned transition layer by dry etching the third surface by a gas using the carbon nanotube composite structure as a first mask, wherein parts of the second surface are exposed, wherein a first reaction between the gas and the protective layer is slower than a second reaction between the gas and the transition layer;

removing the carbon nanotube composite structure; and dry etching the second surface using the patterned transition layer as a second mask.

2. The method of claim 1, wherein the carbon nanotube structure comprises a carbon nanotube film comprising the plurality of carbon nanotubes that are joined end-to-end by van der Waals attractive force therebetween and substantially arranged along the same direction.

3. The method of claim 1, wherein the carbon nanotube structure comprises a plurality of carbon nanotube wires.

4. The method of claim 1, wherein each of the plurality of carbon nanotubes is fully enclosed by the protective layer.

5. The method of claim 1, wherein a thickness of the protective layer is in a range from about 3 nanometers to about 50 nanometers.

6. The method of claim 1, further comprises removing the patterned transition layer after the dry etching the second surface.

* * * * *